United States Patent [19]

Gotta, III et al.

[11] Patent Number: 4,973,863

[45] Date of Patent: Nov. 27, 1990

[54] TTL-ECL INTERFACE CIRCUIT

[75] Inventors: James M. Gotta, III, Fairport; Frank Weiner, Rochester, both of N.Y.

[73] Assignee: Eastman Kodak Company, Rochester, N.Y.

[21] Appl. No.: 458,209

[22] Filed: Dec. 28, 1989

[51] Int. Cl.[5] .................. H03K 19/092; H03K 19/086; H03K 19/088; H03K 17/04

[52] U.S. Cl. .................................. 307/475; 307/456; 307/443; 307/264

[58] Field of Search ............... 307/455, 473, 443, 456, 307/475; 365/219, 189.11, 189.12, 189.05

[56] References Cited

U.S. PATENT DOCUMENTS

| | | | |
|---|---|---|---|
| 4,518,876 | 5/1985 | Constantinescu | 307/455 |
| 4,607,177 | 8/1986 | Lechner | 307/455 |
| 4,639,620 | 1/1987 | Wagenmakers | 307/443 |
| 4,654,549 | 3/1987 | Hannington | 307/473 |
| 4,730,126 | 3/1988 | Chen | 307/456 |
| 4,771,191 | 9/1988 | Estrada | 307/456 |

*Primary Examiner*—Stanley D. Miller
*Attorney, Agent, or Firm*—Edward Dugas

[57] ABSTRACT

A circuit for interfacing (parallel format) TTL signals with a serial format ECL signal port includes a parallel-to-serial shift register, a first voltage level shifting stage and an output, TTL-ECL level shifting stage, connected in cascade. Each of the shift register and the first level shifting stage is powered exclusively by an on-board TTL power supply. The output level shifting stage is powered by the on-board TTL supply and from an external connection to a downstream module. The serial output of the shift register is a 'positive ECL' signal having a voltage swing corresponding to that of conventional negative polarity ECL signals. From this signal the first level shifting stage produces an intermediate level (quasi analog) signal which transitions between reduced or intermediate high and low voltage levels about a switching leel corresponding to that (e.g. +1.5 volts) of normal TTL signals but having the ELC-type voltage swing. This intermediate level TTL type signal is coupled to the output TTL-ECL voltage level shifting stage to which the signal ECL output port to be coupled to the downstream CRT unit is connected. Since the output stage is readily accessible for connection to an external power supply, specifically a −5 volt ECL supply rail of an adjacent, module, it is powered by both the internal TTL supply bus and by an external jumper connection to the module to which the output ECL signals are to be supplied.

16 Claims, 2 Drawing Sheets

TTL-ECL INTERFACE CIRCUIT

FIELD OF THE INVENTION

The present invention relates in general to digital signal processing and is particularly directed to an interface circuit, having minimum ECL power supply availability, for converting parallel formatted TTL logic level signals into a serially formatted output signal stream at ECL logic levels.

BACKGROUND OF THE INVENTION

Because digital signal processing architectures commonly employ both TTL (transistor, transistor logic) and ECL (emitter coupled logic) circuit components, it is often necessary to incorporate TTL-ECL and ECL-TTL conversion circuitry between successive stages of a system. This is especially true in system designs where one or more or the components are off-the-shelf modules, operating at exclusively different logic levels and powered separately by opposite polarity sources. Because the logic level conversion circuitry provides a voltage level shift between opposite polarity voltage levels, a typical conversion circuit will employ a DC-DC converter for supplying the power level of the polarity not normally available on the module. Unfortunately, however, the signal processing module in which the logic level conversion circuitry is to be incorporated may not have the circuitry real estate that will accommodate the auxiliary (and cost increasing) power supply.

SUMMARY OF THE INVENTION

In accordance with the present invention, this problem is successfully addressed by means of an interface circuit substantially the entire portion of which operates off only the power supply bus normally carried by the module, but which performs an intermediate level conversion to a logic level window that will enable an output stage to successfully achieve the target voltage logic level parameters though a single external power connection from the adjacent (downstream) module.

More particularly, the present invention is directed to a circuit arrangement for interfacing first, parallel format (positive polarity) TTL signals (e.g. an eight bit video data word) with a second, serial format (negative polarity) ECL signal stream (for driving an ECL cathode ray tube display). The binary states of the TTL signals transition about a switching level of +1.5 volts between first and second voltage levels (e.g. normal TTL levels of 0.6 volts (logical low) and +3.0 volts (logical high)) at a first frequency (e.g. 25 MHz). The binary states of the ECL signals transition about a switching level of −1.3 volts between third and fourth voltage levels (e.g. normal ECL levels of −0.9 volts (logical high) and −1.8 volts (logical low)), at a second higher frequency (e.g. on the order of 200 MHz).

The multistage circuit arrangement includes a parallel-to-serial shift register, a first or intermediate voltage level shifting stage and an output or TTL-ECL level shifting stage, connected in cascade. Each of the shift register and the first level shifting stage is powered exclusively by an on-board TTL power supply. The output level shifting stage is powered by the on-board TTL supply and from an external connection to the downstream CRT unit.

The shift register converts the parallel format, 25 MHz TTL signals into a 200 MHz, serially formatted output data stream. The binary states of the 200 MHz serial data stream transition between ('positive ECL') voltage levels above normal TTL swings. The first level shifting stage, to which this 'positive' ECL signal is coupled, is configured of ECL logic circuitry which, like the shift register, is powered exclusively by the TTL supply bus. At the output data rate (200 MHz) of the serial data stream, the voltage swings of the output of the first level shifting stage are reduced, as they are unable to track the 'positive ECL' swings output by the shift register. As a consequence, what is produced is an intermediate level (quasi analog) signal which transitions between reduced or intermediate high and low voltage levels at a switching level corresponding to that (e.g. +1.5 volts) of normal TTL signals.

This reduced or intermediate level TTL type signal is coupled to a second or output, TTL-ECL voltage level shifting stage, which is powered by both the internal TTL supply bus and by an external jumper connection to the downstream module to which the output ECL signals are to be supplied. The second voltage level shifting stage produces, from the intermediate TTL type signals, the desired negative polarity ECL output signals.

DETAILED DESCRIPTION

Figure 1:
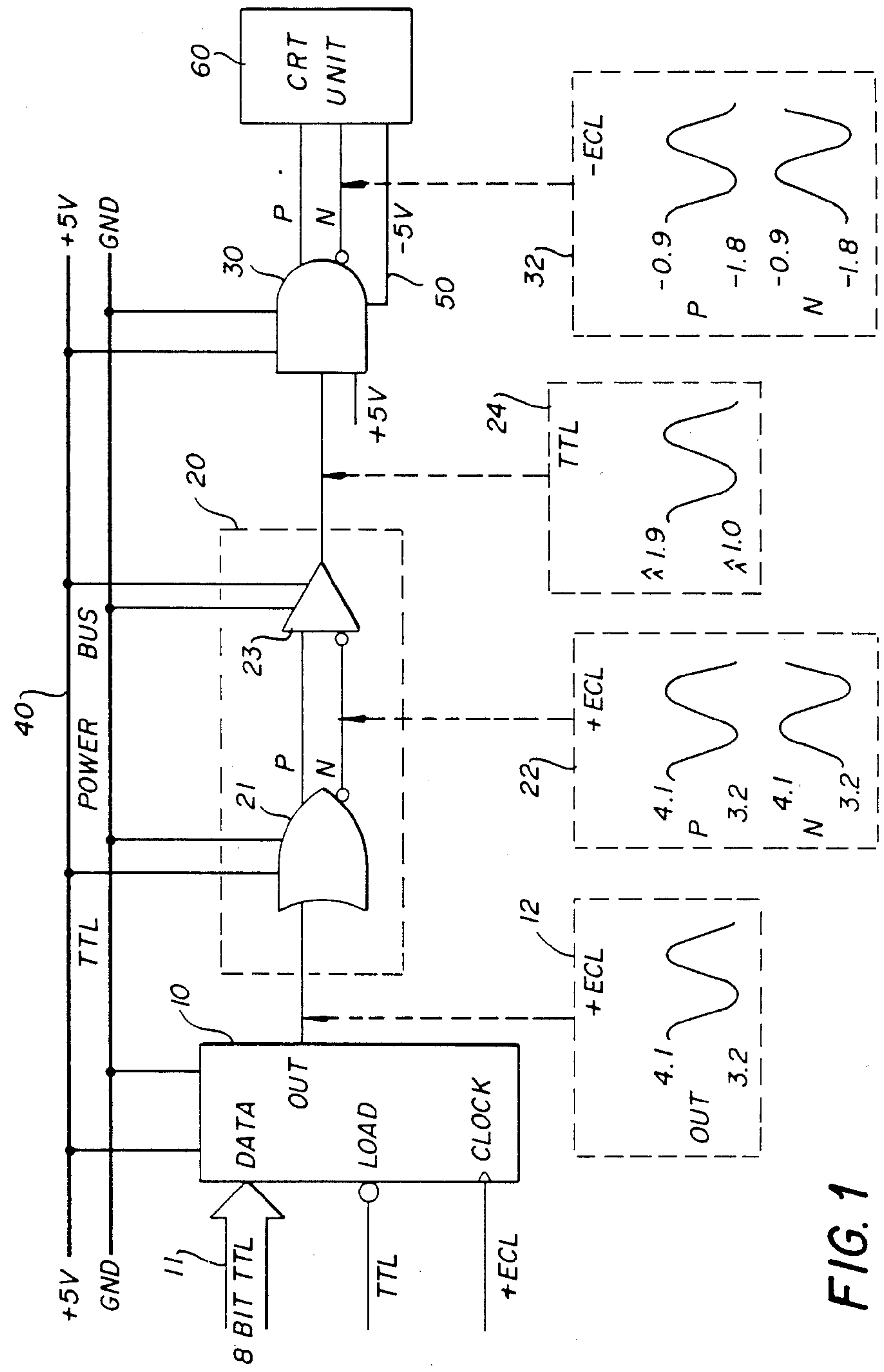
FIG. 1 is a diagrammatic illustration of a TTL-ECL interface circuit in accordance with a preferred embodiment of the present invention.

Referring now to FIG. 1, a TTL-ECL interface circuit in accordance with a preferred embodiment of the present invention is shown as comprising a multistage circuit arrangement of a parallel-to-serial shift register 10, a first or intermediate voltage level shifting stage 20 and an output or TTL-ECL level shifting stage 30, connected in cascade. Each of shift register 10 and first level shifting stage 20 is powered exclusively from an on-board TTL power supply (+5 volts) bus 40. Output level shifting stage 30 is powered from on-board TTL supply bus 40 and from an external connection 50 to an ECL terminal (−5 volts) from a downstream ECL-driven module (e.g. CRT display unit) 60.

Figure 2:
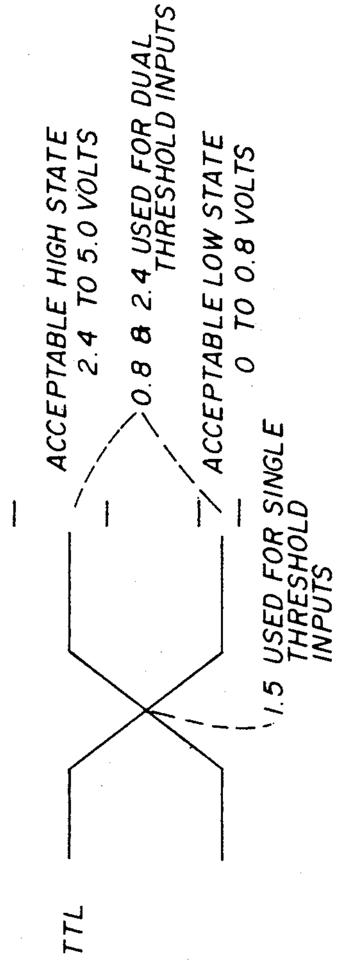
FIGS. 2 and 3 show voltage level variations for TTL-coupled logic and ECL-coupled logic, respectively.
Figure 3:
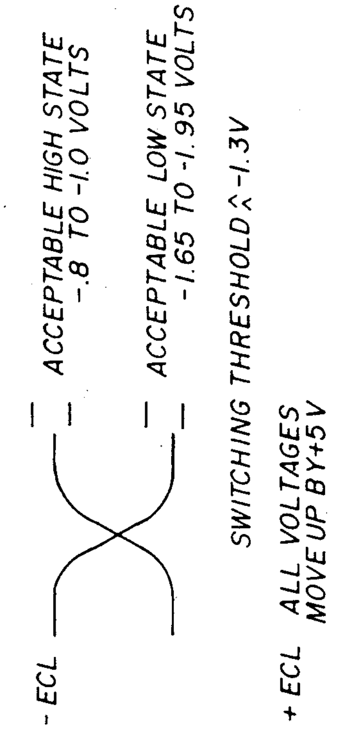

As noted above, the multistage circuit arrangement of the present invention interfaces parallel format (positive polarity) TTL signals, (e.g. a 25 MHz eight bit video data word) that are coupled over a multibit input link 11, with a serial format (negative polarity) ECL output link 32 (for driving downstream ECL cathode ray tube display 60). The binary states of the TTL signals on link 11 typically transition about a switching level of +1.5 volts between first and second voltage levels (e.g. normal TTL levels of 0.6 volts (logical low) and +3.0 volts (logical high)) as shown in FIG. 2, while the binary states of the output ECL signals on link 32 typically transition about a switching level of −1.3 volts between third and fourth voltage levels (e.g. normal ECL levels of −0.9 volts (logical high) and −1.8 volts (logical low)), as shown in FIG. 3.

Shift register 10 converts the parallel format, 25 MHz TTL signals on link 11 into an increased data rate (e.g. 200 MHz), serially formatted output data stream. Normally, if both TTL and ECL power supply buses were available (the latter by way of an auxiliary DC-DC voltage converter, for example), shift register 10, which contains TTL-ECL internal logic, would be powered from both busses and would produce a negative ECL-compatible output stream. In this case, however, since the negative supply is unavailable, shift register 10 can be powered only by the TTL supply bus. Consequently, the particular component chosen for shift register 11 must be one that can be driven only by a positive supply. For this purpose, shift register 10 may comprise a type 679501 shift register manufactured by AMD. When so powered, shift register 10 produces a serial output stream, the binary states of which transition between positive voltage levels (on the order of +3.2 volts and +4.1 volts, or above normal TTL swings), but which have a voltage swing corresponding to that of ECL logic, namely on the order of 0.9 volts, as shown by the signal traces 12 at the output of shift register 20 in FIG. 1. Such signals will hereinafter be referred to as 'positive ECL' signals. Because these 'positive ECL' signals transition about a switching level (+3.7 volts) that is considerably greater than TTL levels they are level-shifted to a reduced switching level that is compatible with a TTL switching level (+1.5 volts).

For this purpose, the 'positive' ECL signal produced by shift register 10 is coupled to first voltage level shifting stage 20, which is configured of ECL logic circuitry and, like shift register, is powered exclusively by TTL supply bus 40. As shown in FIG. 1, level shifting stage 20 may be comprised of a dual polarity output ECL OR gate 21, which (shown at traces 22 in FIG. 1) are coupled to an ECL driver 23 (which operates of differential inputs). Because ECL-configured shift stage 20 is powered by TTL supply bus 40, its response time is relatively slow at the 200 MHz data rate of the serial data stream. As a result, the voltage swings of the output signal (trace 24) from voltage level shifting stage 20 are reduced in amplitude, as they are unable to track the 'positive ECL' swings output by shift register 20. What is produced is an intermediate level (quasi analog) signal which transitions between reduced or intermediate high and low voltage levels at a switching level corresponding to that (e.g. +1.5 volts) of normal TTL signals and having an ECL-type voltage swing (0.9 volts, as shown by signal trace 24).

This reduced or intermediate level TTL type signal is coupled to the second, or output, TTL-ECL voltage level shifting stage 30 to which the signal ECL output port to be coupled to the downstream CRT unit is connected. Since stage 30 is readily accessible for connection to an external power supply, specifically the −5 volt ECL supply rail of the adjacent, downstream CRT module, it is powered by both the internal TTL supply bus 40 and by an external jumper connection 50 to the CRT module to which the output ECL signals are to be supplied. Since the intermediate level TTL type signal produced by stage 20 is centered about a standard TTL switching level of +1.5 volts, it is compatible with the operation of TTL-ECL voltage level shifting stage 30 which produces, from these intermediate TTL type signals, the desired negative polarity ECL output signals.

As will be appreciated from the foregoing description, the lack of circuit component real estate for providing an auxiliary DC-DC converter to serve the power level requirements of TTL-ECL conversion circuitry between successive stages of a system is successfully addressed in accordance with the present invention by means of an interface circuit substantially the entire portion of which operates off only the power supply bus normally carried by the module, but which performs an intermediate level conversion to a logic level window that will enable an output stage to successfully achieve the target voltage logic level parameters though a single external power connection from the adjacent module.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A circuit arrangement for converting first digital signals of a first polarity type which transition between first and second voltage levels, to second digital signals of a second polarity type which transition between third and fourth voltage levels comprising:

a first voltage level shifter which is coupled to receive said first digital signals and produces third signals of said first polarity type, said third signals transitioning between fifth and sixth voltage levels of said first polarity, said fifth and sixth voltage levels being different from said first and second voltage levels and having a differential therebetween corresponding to that between said third and fourth voltage levels;

a second voltage level shifter coupled to receive the third signals produced by said first voltage level shifter, and producing fourth signals which switch, relative to a voltage level corresponding to that at which said first signals switch between said first and second voltage levels, between voltage levels the differential between which corresponds to that between said third and fourth voltage levels; and a third voltage level shifter coupled to receive said fourth signals and shifting the voltage levels thereof to those of said second digital signals.

2. A circuit arrangement according to claim 1, wherein each of said first and second voltage level shifters is powered exclusively by a first polarity power supply and said third voltage level shifter is powered at each of said first and second polarities.

3. A circuit arrangement according to claim 2, wherein said first polarity is a positive polarity and said second polarity is a negative polarity.

4. A circuit arrangement according to claim 3, wherein said first digital signals are TTL signals and said second signals are ECL signals.

5. A circuit arrangement for interfacing positive polarity TTL signals which transition between first and second voltage levels, to negative polarity ECL signals which transition between third and fourth voltage levels comprising:

a first voltage level shifter which is coupled to receive said TTL signals and produces positive polarity ECL-type signals which transition between fifth and sixth voltage levels of said first polarity, said fifth and sixth voltage levels being different from said first and second voltage levels and having a differential therebetween corresponding to that between said third and fourth voltage levels;

a second voltage level shifter coupled to receive the positive polarity ECL-type third signals produced by said first voltage level shifter, and producing TTL-type signals which switch about a voltage level corresponding to that at which the TTL signals switch between said first and second voltage levels between voltage levels the difference between which corresponds to an ECL signal swing; and a third, TTL-ECL voltage level shifter, coupled to receive said fourth TTL-type signals and shifting the voltage levels of the binary states thereof to negative polarity ECL levels.

6. A circuit arrangement according to claim 5, wherein each of said first and second voltage level shifters is powered exclusively by a positive polarity TTL power supply and said third TTL-ECL voltage level shifter is powered at each of said positive and negative voltage polarities.

7. A circuit arrangement for converting a parallel input of first digital signals, the binary states of which transition at a first frequency between first and second voltage levels of a first polarity, to a serial output of second digital signals, the binary states of which transition at a second frequency, higher than said first frequency, between third and fourth voltage levels of a second polarity, comprising:

a parallel-to-serial shift register having a parallel input port to which said parallel input of first digital signals is applied, said shift register producing, at a serial output thereof, third digital signals the binary states of which transition at said second frequency between fifth and sixth voltage levels of said first polarity, said fifth and sixth voltage levels being larger than said first and second voltage levels and having a voltage swing corresponding to that between said third and fourth voltage levels;

a first voltage level shifter having an input terminal coupled to receive said third digital signals and producing fourth digital signals of said first polarity and said second frequency, the binary states of said fourth digital signals switching at a voltage level corresponding to that at which said first digital signals switch between the binary states thereof; and a second voltage level shifter having an input terminal coupled to receive the fourth digital signals produced by said first voltage level shifter and shifting the voltage levels thereof to produce said second digital signals.

8. A circuit arrangement according to claim 7, wherein each of said shift register and said first voltage level shifter is powered by a voltage polarity exclusive of said second polarity.

9. A circuit arrangement according to claim 8, wherein said second voltage level shifter is powered by voltages at each of said first and second polarities.

10. A circuit arrangement according to claim 7, wherein said first digital signals are positive polarity TTL signals and said second digital signals are negative polarity ECL signals.

11. A circuit arrangement according to claim 10, wherein said first voltage level shifter is configured of ECL logic circuitry.

12. A circuit arrangement for interfacing first, parallel format, positive polarity TTL signals, the binary states of which transition at a first frequency between first and second voltage levels, to second, serial format, negative polarity ECL signals, the binary states of which transition at a second frequency, higher than said first frequency, between third and fourth voltage levels comprising:

a parallel-to-serial shift register, to respective parallel inputs of which said first, parallel format TTL signals are coupled, said shift register producing, at a serial output thereof, third signals the binary states of which transition at said second frequency between fifth and sixth voltage levels of said first polarity, said fifth and sixth voltage levels being larger than said first and second voltage levels and a voltage swing corresponding to that between said third and fourth voltage levels;

a first voltage level shifter, configured of ECL logic circuitry and coupled to receive the third signals produced by said shift register, said first voltage level shifter producing fourth signals of said first polarity and said second frequency, the binary states of said fourth signals switching at a voltage level corresponding to that at which said first signals switch between the binary states thereof; and a second, TTL-ECL voltage level shifter, coupled to receive said fourth signals and shifting the voltage levels of the binary states thereof to negative polarity ECL levels.

13. A circuit arrangement according to claim 12, wherein each of said shift register and said first voltage level shifter is powered exclusively by a positive polarity power supply and said second TTL-ECL voltage level shifter is powered at each of said positive and negative voltage polarities.

14. A method of converting first, parallel format, positive polarity TTL signals, the binary states of which transition at a first frequency between first and second voltage levels, to second, serial format, negative polarity ECL signals, the binary states of which transition at a second frequency, higher than said first frequency, between third and fourth voltage levels comprising the steps of:

(a) coupling said first, parallel format TTL signals to respective parallel inputs of a parallel-to-serial shift register, said shift register producing, at a serial output thereof, third signals the binary states of which transition at said second frequency between fifth and sixth voltage levels of said first polarity, said fifth and sixth voltage levels being larger than said first and second voltage levels and a voltage swing corresponding to that between said third and fourth voltage levels;

(b) coupling said third signals to a first voltage level shifter which produces fourth signals of said first polarity and said second frequency, the binary states of said fourth signals switching at a voltage level corresponding to that at which said first signals switch between the binary states thereof; and (c) coupling said fourth signals to a second TTL-ECL voltage level shifter which produces said serial format, negative polarity ECL signals.

15. A method according to claim 14, wherein each of said shift register and said first voltage level shifter is powered exclusively by a positive polarity power supply and said second TTL-ECL voltage level shifter is powered at each of said positive and negative voltage polarities.

16. A method according to claim 15, wherein said first voltage level shifter is configured of ECL logic circuitry.

* * * * *